US008330129B1

(12) United States Patent
Lee

(10) Patent No.: US 8,330,129 B1
(45) Date of Patent: Dec. 11, 2012

(54) UNIFORMITY OF A SCANNED ION BEAM

(75) Inventor: William D. Lee, Newburyport, MA (US)

(73) Assignee: Axcelis Technologies Inc., Beverly, MA (US)

( * ) Notice: Subject to any disclaimer, the term of this patent is extended or adjusted under 35 U.S.C. 154(b) by 0 days.

(21) Appl. No.: 13/216,812

(22) Filed: Aug. 24, 2011

(51) Int. Cl.
*H01J 3/14* (2006.01)
*G21K 5/10* (2006.01)

(52) U.S. Cl. ............ 250/492.23; 250/492.3; 250/492.21; 250/397; 250/503.1; 324/71.3

(58) Field of Classification Search .................. 250/299, 250/332, 370.1, 396 R, 397, 484.5, 489, 492.1, 250/492.2, 492.21, 492.22, 492.23, 492.3, 250/503.1, 505.1, 526, 559.01, 559.06; 324/71.1, 324/71.3, 71.4, 76.11
See application file for complete search history.

(56) References Cited

U.S. PATENT DOCUMENTS

| 7,279,882 | B1 * | 10/2007 | Degtiarenko et al. ........ 324/71.3 |
| 7,508,487 | B2 * | 3/2009 | Mulkens et al. ................ 355/30 |
| 2003/0053597 | A1 * | 3/2003 | Flohr et al. .................... 378/156 |
| 2004/0160583 | A1 * | 8/2004 | Hubertus Mulkens et al. . 355/30 |
| 2010/0078577 | A1 * | 4/2010 | Moriya et al. ............ 250/504 R |

* cited by examiner

*Primary Examiner* — Bernard E Souw
(74) *Attorney, Agent, or Firm* — Eschweiler & Associates, LLC

(57) ABSTRACT

One embodiment relates to an ion implanter. The ion implanter includes an ion source to generate an ion beam, as well as a scanner to scan the ion beam across a surface of a workpiece. The ion implanter also includes an array of absorption and radiation elements arranged to absorb energy of the scanned ion beam and radiate at least some of the absorbed energy away from the propagation direction. A detection element (e.g., an infrared detector) is arranged to detect energy (e.g., in the form of heat) radiated by the array of absorption and radiation elements and to determine a beam profile of the scanned ion beam based on the detected energy.

27 Claims, 5 Drawing Sheets

UNIFORMITY OF A SCANNED ION BEAM

BACKGROUND

In ion implantation systems, an ion beam is directed towards a work piece (e.g., a semiconductor wafer, or a display panel) to implant ions into a lattice thereof. Once embedded into the lattice of the workpiece, the implanted ions change the physical and/or chemical properties of the implanted workpiece regions, relative to un-implanted regions. Because of this, ion implantation can be used in semiconductor device fabrication, metal finishing, and various applications in materials science research.

During a typical implantation process, the ion beam has a cross-sectional area that is significantly smaller than the surface area of a workpiece to be implanted. Because of this, typical ion beams are scanned over the surface of the workpiece to achieve a specified doping profile in the workpiece. For example, FIG. 1A shows an end view of a conventional ion implantation system 100 where an ion beam 102 traces over a scan path 104 to implant ions into the lattice of a workpiece 106. During this tracing, the ion beam 102 is often scanned over a first axis 108 (e.g., electrically or magnetically scanned) while the workpiece 106 is mechanically translated over a second axis 110. However, the beam could also be electrically or magnetically scanned over both the first and second axes 108, 110 in other embodiments.

Unfortunately, however, as the ion beam 102 traces over the scan path 104, the shape and/or cross-sectional area of the beam can vary somewhat, such as shown in FIGS. 1B-1F. For example, FIGS. 1B-1F show that as the beam 102 scans across the workpiece 106, the width of the beam can be larger near the center of the workpiece (central width $W_c$ in FIG. 1D) and smaller near the edges (e.g., left and right widths, $W_{L1}$, $W_{R1}$ as shown in FIGS. 1B, 1F, respectively). If these variations in beam width are not accurately measured and accounted for, the doping profile actually formed in the workpiece 106 can differ from the specified doping profile. Such differences can result in the implanted workpiece not functioning as specified.

In order to help ensure that the ions actually implanted into a workpiece are commensurate with a desired dosing profile, ion implanters often include a beam profiler. A beam profiler measures the flux or current of the ion beam at different regions on the scan path 104, and assembles these values to generate a beam profile. Although conventional beam profilers are known, conventional beam profilers require substantial mechanical assemblies and/or complex signal processing. Therefore, aspects of the present disclosure relate to improved beam profiling techniques.

SUMMARY

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

One embodiment relates to an ion implanter. The ion implanter includes an ion source to generate an ion beam, as well as a scanner to scan the ion beam generally in a propagation direction across a surface of a workpiece. The ion implanter also includes an array of absorption and radiation elements arranged to absorb energy of the scanned ion beam and radiate at least some of the absorbed energy away from the propagation direction. A detection element is arranged to detect energy radiated by the array of absorption and radiation elements and to determine a beam profile of the scanned ion beam based on the detected energy.

The following description and annexed drawings set forth in detail certain illustrative aspects and implementations of the invention. These are indicative of but a few of the various ways in which the principles of the invention may be employed.

DETAILED DESCRIPTION

Figure 1A:
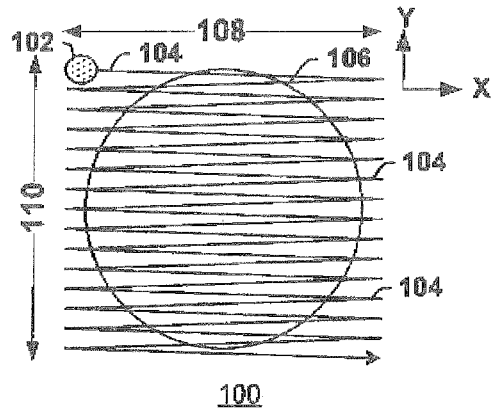
FIGS. 1A-1F illustrate a conventional ion scanning technique.
Figure 1B:
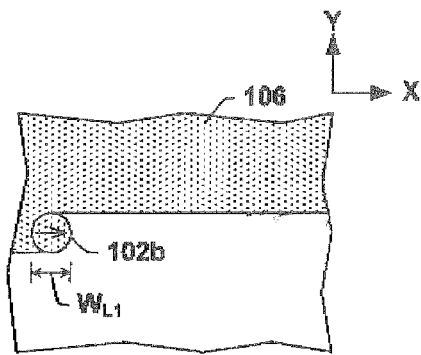
Figure 1C:
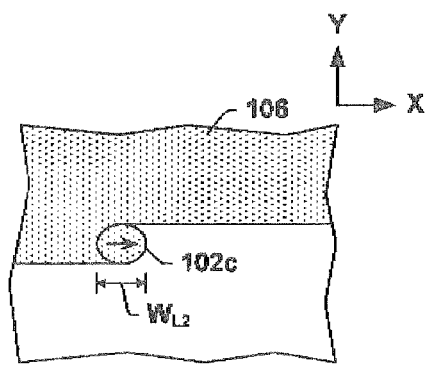
Figure 1D:
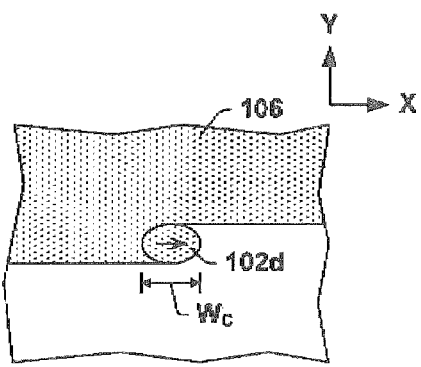
Figure 1E:
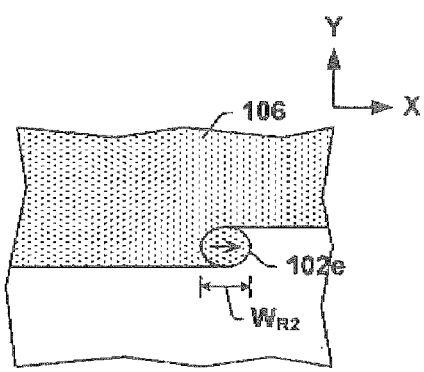
Figure 1F:
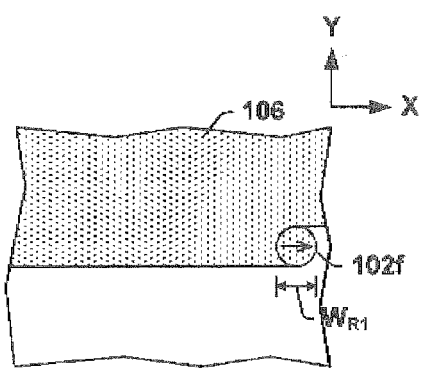

The present invention will now be described with reference to the drawings wherein like reference numerals are used to refer to like elements throughout, and wherein the illustrated structures are not necessarily drawn to scale.

Some embodiments of the present invention relate to improved beam profiling techniques. For example, to profile a scanned ion beam, many embodiments include a beam profiler that includes an array of absorption and emission elements arranged in the path of the scanned beam. As the beam impinges on the different absorption and emission elements, the impinged upon elements absorb energy and heat up. By measuring the temperatures of the individual absorption and emission elements (e.g., by snapping one or a series of infrared pictures), an infrared detector can determine the amount of beam current impingent on the various regions of the array, thereby allowing an accurate beam profile to be measured.

Figure 2:
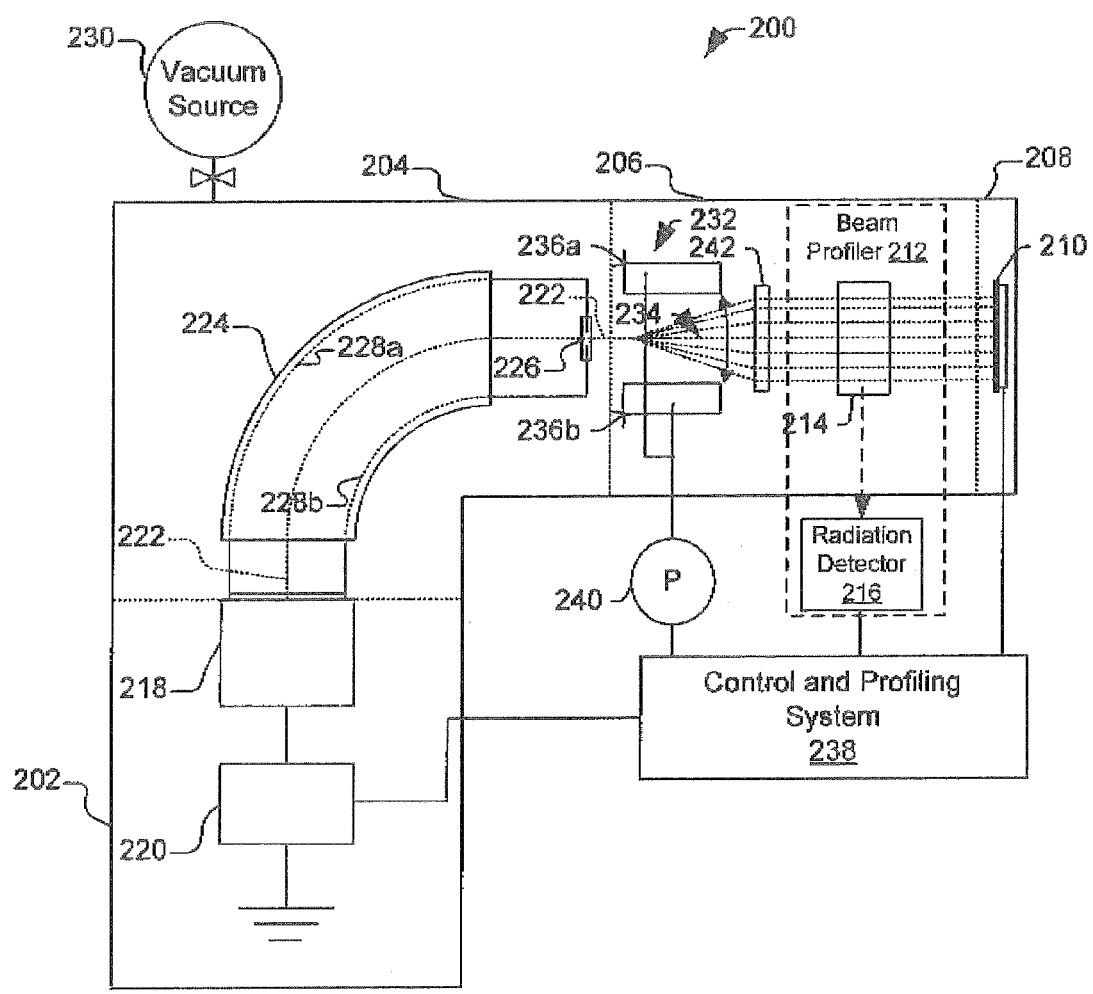
FIG. 2 illustrates an ion implantation system, which includes an improved beam profiler in accordance with some embodiments.

FIG. 2 illustrates one embodiment of an ion implantation system 200 operable to carry out beam profiling techniques in accordance with some aspects of the invention. The ion implantation system 200 includes a source terminal 202, a beamline assembly 204, a scan system 206, and an end station 208, which are collectively arranged so as to inject ions (dopants) into the lattice of a workpiece 210 according to a specified dopant profile. In addition, the ion implantation system 200 includes a beam profiler 212, which includes of an array of absorption and radiation elements 214 and a radiation detector 216.

During operation, an ion source 218 in the source terminal 202 is coupled to a high voltage power supply 220 to ionize dopant molecules (e.g., dopant gas molecules) and accelerate the ionized dopant molecules to form a pencil ion beam 222.

To steer the pencil beam 222 from the source terminal 202 towards the workpiece 210, the beamline assembly 204 has a mass analyzer 224 in which a dipole magnetic field is established to pass only ions of appropriate charge-to-mass ratio through a resolving aperture 226. Ions having an inappropriate charge-to-mass ratio collide with the sidewalls 228a, 228b; thereby leaving only the ions having the appropriate charge-to-mass ratio to pass though the resolving aperture 226 and into the workpiece 210. The beam line assembly 204 may also include various beam forming and shaping structures extending between the ion source 218 and the end station 208, which maintain the pencil beam 222 in an elongated interior cavity or passageway through which the pencil beam 222 is transported to the workpiece 210. A vacuum pumping system 230 typically keeps the ion beam transport passageway at vacuum to reduce the probability of ions being deflected from the beam path through collisions with air molecules.

Upon receiving the steered pencil beam 222, a scanner 232 within the scan system 206 laterally diverts or "scans" the pencil beam back and forth in time (e.g., in a horizontal direction), thereby providing a scanned ion beam 234. In some contexts, this type of scanned pencil beam may be referred to as a ribbon beam. In the illustrated embodiment, the scanner 232 is an electrical scanner that includes a pair of electrodes 236a, 236b arranged on opposing sides of the scanned beam 234. A control system 238 induces a change in a variable power source 240 to provide a time-varying current or voltage on the electrodes 236a, 236b, thereby inducing an oscillatory time-varying electric field in the beam path region and scanning the ion beam back and forth over a first axis in time. In other embodiments, the scanner 232 can be a magnetic scanner that provides a time-varying magnetic field in the beam path region, thereby scanning the ion beam over the first axis in time. In some embodiments, only a single electrode or magnet (rather than a pair of electrodes/magnets) can be used. The control system 238 can also control translational movement of a chuck, on which the workpiece is mounted, such that the ion beam tracers over a scan path (e.g., as shown in FIG. 1A).

Downstream of the scanner 232, a parallelizer 242 can redirect the scanned ion beam 234 so that the scanned ion beam strikes a surface of the workpiece 210 at the same angle of incidence over the entire surface of the workpiece.

To monitor the beam and help ensure proper calibration thereof, the beam profiler 212 includes an array of absorption and radiation elements 214, which are configured to absorb energy from the scanned beam 234 and radiate energy based on the energy absorbed. The radiation detector 216 detects this radiated energy and can determine a beam profile based on the detected energy. For example, in many embodiments, the individual absorption and radiation elements in the array 214 change their respective temperatures based on the energy they absorb from the scanned ion beam 234. When heated, the individual absorption and radiation elements radiate photons (e.g., infrared radiation), which are then detected by the detection element 216 (e.g., an infrared detector). For example, if the radiation detection element is an infrared camera, it can take a series of pictures of the array 214 in rapid succession to measure the temperature of the individual elements as the beam passes thereover. Because the temperature of the elements corresponds to the amount of beam energy they have absorbed from the beam, the elements' respective temperatures provides a good representation of the beam profile.

In some embodiments, the ion implantation system can include a window 244 arranged between the radiation detector 216 and the array of absorption and radiation elements 214. This window 244 allows photons having the expected energy (e.g., photons in the infrared region of the spectrum) to pass there through, and can in some instances block photons of other energies. For example, for an infrared detector, a silicon window could be used, among others; while for a visible light detector, a glass window could be used, among others.

Figure 3:
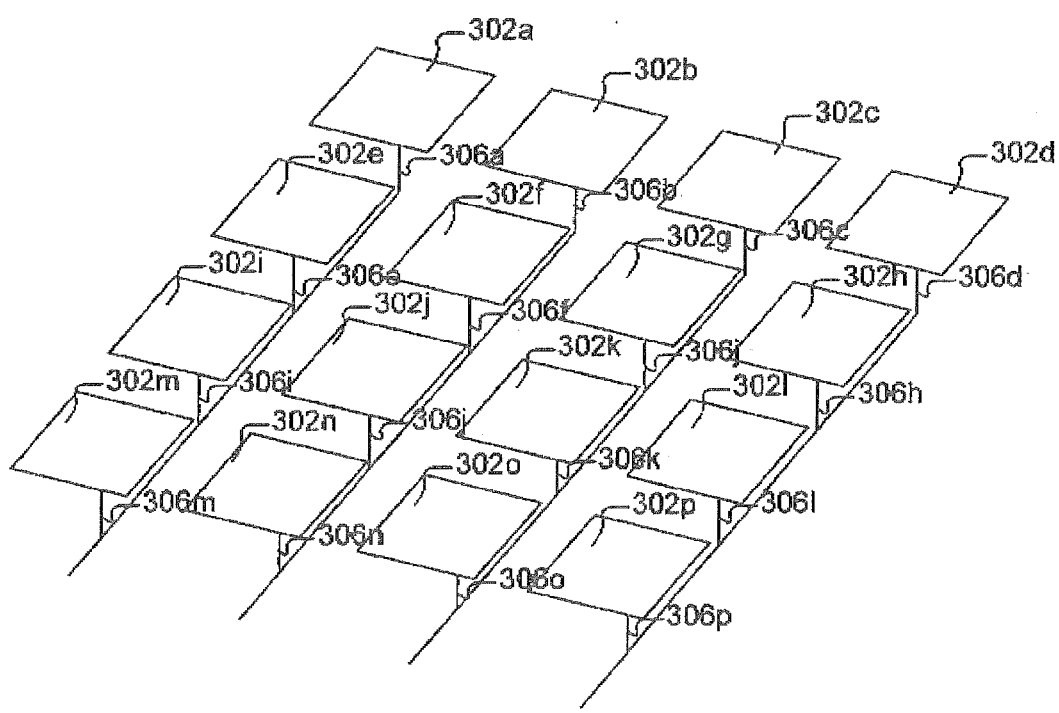
FIG. 3 illustrates an isometric view of an array of absorption and radiation elements which can be included in a beam profiler in accordance with some embodiments.
Figure 4:
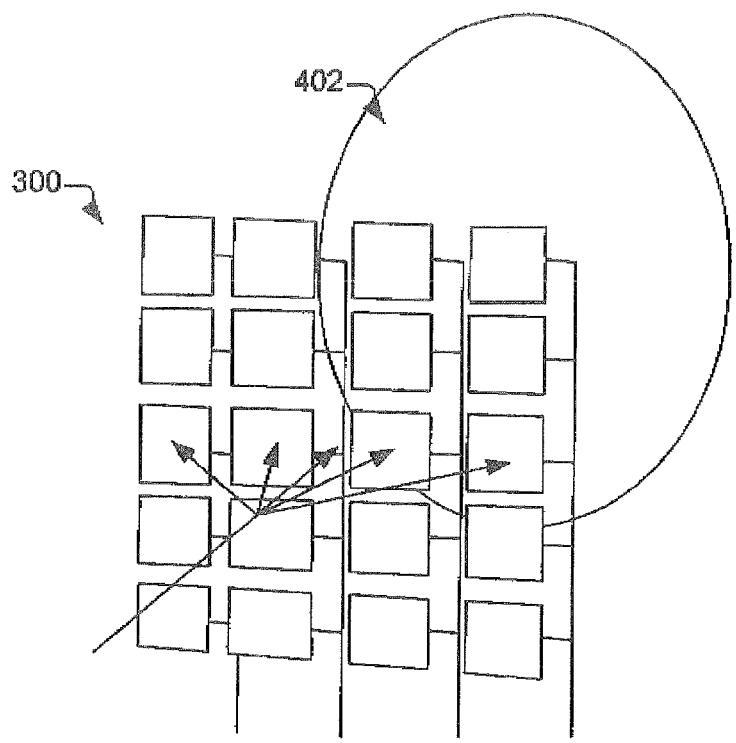
FIG. 4 illustrates a perspective view of the array of absorption and radiation elements positioned between a scanner and a workpiece chuck.

FIGS. 3-4 show an array of absorption and radiation elements (e.g., array 214 of FIG. 2) in accordance with some embodiments. In these examples, the array 300 is made up of sixteen absorption and radiation elements 302a-302p arranged in a four-by-four grid. However, it will be appreciated that including more than sixteen absorption and radiation elements will provide a more accurate beam profile measurement, although fewer than sixteen absorption and radiation elements can also be included. In practice an array of hundreds or even thousands of absorption and radiation elements might be best for detailed profile measurements.

The absorption and radiation elements 302a-302p have respective faces arranged at least approximately perpendicular to the beam's propagation direction 304, and are also arranged atop respective standoff members 306a-306p. The absorption and radiation elements and the standoff members can be made of the same material or of different materials, depending on the implementation.

The absorption and radiation elements 302a-302p often have a surface area to volume ratio that is quite high. That is, a depth of an absorption and radiation element, as measured from the face, is substantially less than a length and/or width of the face. The absorption and radiation elements are typically made of a material with a low specific heat capacity (e.g., lower than 0.5 J/g K). This helps ensure that the absorption and radiation elements have a large beam collection area and small thermal mass, such that a small amount of beam current being absorbed corresponds to a large increase in temperature. The absorption and radiation elements are typically made of a material with a low thermal conductivity (e.g., lower than 2 W/cm K). Tantalum, tungsten, molybdenum, and/or some ceramics are good choices, among others. These also have the advantage that they have low sputter yields, thereby allowing the absorption and radiation elements to last longer.

The standoffs 306a-306p are also thin and of poor thermal conductivity, such that the absorption and radiation elements thermally "float".

Figure 5:
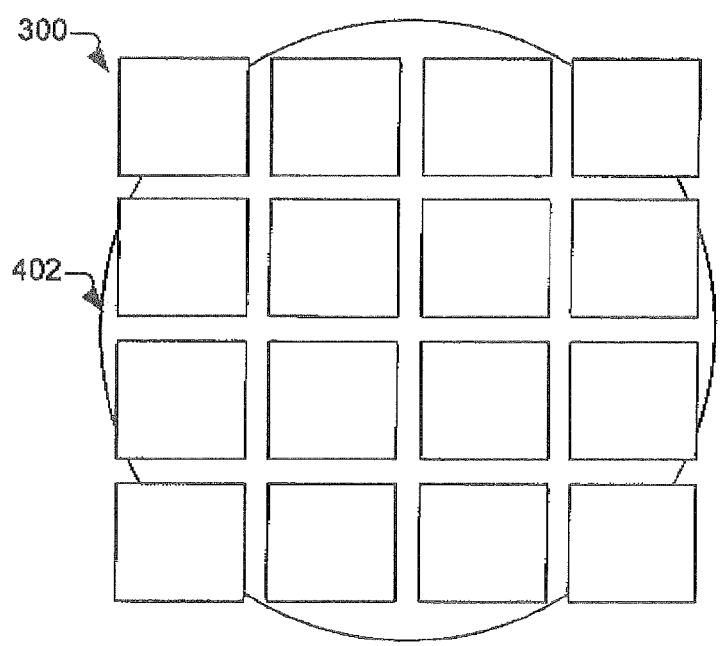
FIG. 5 shows a beam profiler made up of an array of absorption and radiation elements, as seen from upstream in the beam path, in accordance with some embodiments.

As shown in FIGS. 4-5, the array 300 can be positioned between a scanner, which diverts the beam, and a chuck 402. The chuck 402 is configured to hold a workpiece, and can often be translated along a second axis while the ion beam is scanned over a first axis. Thus, during beam profiling, the array 300 is inserted into the beam path to obtain a beam profile. After profiling is complete, the array 300 is removed or shuttered from the beamline (e.g., via a mechanical arm or assembly) and a workpiece can be placed in the chuck 402 and implantation can be carried out thereon.

Figure 6:
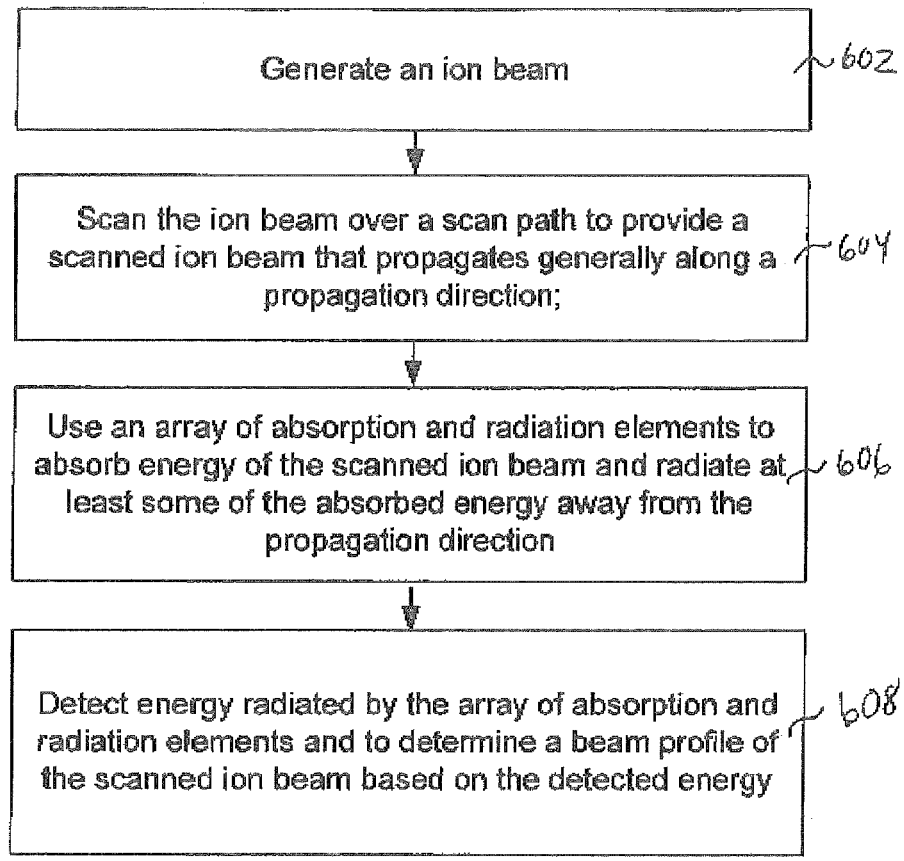
FIG. 6 illustrates a method of beam profiling in accordance with some embodiments.

FIG. 6 shows a method in accordance with some embodiments. The method starts at 602, wherein an ion beam is generated.

At 604, the ion beam is scanned over a scan path to provide a scanned ion beam. Despite being scanned, the ion beam still propagates generally along a propagation direction.

At 606, the method uses an array of absorption and radiation elements to absorb energy of the scanned ion beam and radiate at least some of the absorbed energy away from the propagation direction.

At 608, the method detects energy radiated by the array of absorption and radiation elements, and determines a beam profile of the scanned ion beam based on the detected energy.

Although the invention has been illustrated and described with respect to one or more implementations, alterations and/or modifications may be made to the illustrated examples without departing from the spirit and scope of the appended claims. For example, although some embodiments have been described above with respect to infrared radiation being radiated and detected to determine a beam profile, any other portion of the electromagnetic spectrum could also be used. For example, in other embodiments, the absorption and radiation elements could emit visible light or radio waves at a pre-determined wave length, and the radiation detector can be chosen appropriately to detect this pre-determined wavelength or spectrum of wavelengths. One advantage of infrared radiation is that it is relatively low-energy, and hence can be used to detect very low-intensity beams. In contrast, visible light is higher energy and a low-intensity beam may not be able to cause the structure to emit visible light.

In addition, different types of end stations 208 may be employed in the ion implantation system 200. In some embodiments, a "batch" type end station can simultaneously support multiple workpieces on a rotating support structure, wherein the workpieces are rotated through the path of the ion beam until all the workpieces are completely implanted. A "serial" type end station, on the other hand, can be used in other embodiments. Serial type end stations support a single workpiece along the beam path for implantation, wherein multiple workpieces are implanted one at a time in serial fashion, with each workpiece being completely implanted before implantation of the next workpiece begins.

In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implanter comprising:
   an ion source to generate an ion beam;
   an array of absorption and radiation elements arranged to absorb energy of the ion beam as the ion beam propagates in a propagation direction, and configured to radiate at least some of the absorbed energy away from the propagation direction; and
   a detection element to detect energy radiated by the array of absorption and radiation elements and to determine a beam profile of the ion beam based on the detected energy.

2. The ion implanter of claim 1, further comprising:
   a chuck configured to hold a workpiece; and
   a controller configured to mechanically translate the chuck in two directions that are generally perpendicular to the propagation direction while the ion beam remains substantially stationary.

3. The ion implanter of claim 1, further comprising:
   a scanner to scan the ion beam along a scan path, thereby providing a scanned ion beam that propagates generally along the propagation direction;
   wherein the array of absorption and radiation element are arranged to absorb energy of the scanned ion beam and configured to radiate at least some of the absorbed energy away from the propagation direction.

4. The ion implanter of claim 3, further comprising:
   a chuck downstream of the scanner and configured to hold a workpiece; and
   a controller configured to move the chuck along a translational axis while the beam is scanned along the scan path.

5. The ion implanter of claim 4, further comprising:
   a parallelizer positioned between the scanner and the chuck, wherein the parallelizer receives the scanned ion beam at a plurality of different impingent angles in time and alters the different impingent angles of the scanned ion beam to output a parallelized ion beam in time.

6. The ion implanter of claim 1, wherein the absorption and radiation elements are configured to change their respective temperatures based on the energy they absorb from the generated ion beam; and wherein the detection element is an infrared detector, or camera, arranged to detect the change in the respective temperatures of the absorptions and radiation elements.

7. The ion implanter of claim 1, wherein the absorption and radiation elements are configured to change their respective temperatures based on the energy they absorb from the generated ion beam; and wherein the detection element is a visible light detector, or camera, arranged to detect the change in the respective temperatures of the absorptions and radiation elements.

8. The ion implanter of claim 1, where an absorption and radiation element has a face arranged at least approximately perpendicular to the propagation direction.

9. The ion implanter of claim 8, wherein the absorption and radiation element is arranged atop a standoff member.

10. The ion implanter of claim 9, wherein the absorption and radiation element and the standoff member are made of the same material.

11. The ion implanter of claim 9, wherein the absorption and radiation element and the standoff member are made of different materials.

12. The ion implanter of claim 9, wherein the standoff member has a specific heat capacity less than 0.5 J/g K.

13. The ion implanter of claim 9, wherein the standoff member has a thermal conductivity less than 2 W/cm K.

14. The ion implanter of claim 1, wherein the absorption and radiation element has a depth measured from the face, and wherein the depth is substantially less than a length or width of the face.

15. The ion implanter of claim 1, wherein an absorption and radiation element comprises at least one of the following materials: tantalum, tungsten, molybdenum, or ceramic.

16. The ion implanter of claim 1, wherein an absorption and radiation element has a specific heat capacity less than 0.5 J/g K.

17. The ion implanter of claim 1, wherein an absorption and radiation element has a thermal conductivity of less than 2 W/cm K.

18. A method for implanting ions into a workpiece, comprising:
   generating an ion beam;
   scanning the ion beam back and forth to provide a scanned ion beam that propagates generally in a propagation direction;
   absorbing energy of the scanned ion beam with an array of absorption and emission elements and radiating at least some of the absorbed energy away from the absorption and emission elements;
   detecting energy radiated by the array of absorption and radiation elements;
   determining a beam profile of the scanned ion beam based on the detected energy.

19. The method of claim 18, wherein the energy radiated and detected is in the infrared region of the electromagnetic spectrum.

20. The method of claim 18, wherein the energy radiated and detected is in the visible region of the electromagnetic spectrum.

21. The method of claim 18, where an absorption and radiation elements have respective faces arranged at least approximately perpendicular to the propagation direction.

22. The method of claim 18, wherein the absorption and radiation elements are arranged atop respective standoff members.

23. The method of claim 22, wherein the absorption and radiation element and the standoff member are made of the same material.

24. The method of claim 22, wherein the absorption and radiation element and the standoff member are made of different materials.

25. The method claim 18, wherein an absorption and radiation element comprises at least one of the following materials: tantalum, tungsten, molybdenum, or ceramic.

26. The method of claim 18, wherein an absorption and emission element is made of a material having a thermal conductivity less than 2 W/cm K.

27. The method of claim 26, wherein the absorption and radiation element has a depth measured from the face, and wherein the depth is substantially less than a length or width of the face.

\* \* \* \* \*